United States Patent [19]
Chang et al.

[11] Patent Number: 6,143,579
[45] Date of Patent: Nov. 7, 2000

[54] EFFICIENT METHOD FOR MONITORING GATE OXIDE DAMAGE RELATED TO PLASMA ETCH CHAMBER PROCESSING HISTORY

[75] Inventors: Chia-Der Chang, Chia-I; Chi-Hung Liao, Taipei; Dean-E Lin; Sheng-Liang Pan, both of Hsin-Chu, all of Taiwan

[73] Assignee: Taiwan Semiconductor Manufacturing Ltd., Hsin-Chu, Taiwan

[21] Appl. No.: 09/298,936

[22] Filed: Apr. 26, 1999

[51] Int. Cl.[7] ..................................................... H01L 21/66
[52] U.S. Cl. ................................................. 438/17; 438/14
[58] Field of Search ........................................ 438/14, 17

[56] References Cited

U.S. PATENT DOCUMENTS

| | | | |
|---|---|---|---|
| 5,548,224 | 8/1996 | Gabriel et al. | 324/765 |
| 5,646,074 | 7/1997 | Chen et al. | 438/773 |
| 5,739,052 | 4/1998 | Krishnan et al. | 438/17 |
| 5,759,871 | 6/1998 | Hause et al. | 438/18 |
| 5,781,445 | 7/1998 | Shiue et al. | 364/481 |
| 5,804,975 | 9/1998 | Alers et al. | 324/613 |
| 6,028,324 | 2/2000 | Su et al. | 257/48 |
| 6,043,102 | 3/2000 | Fang et al. | 438/14 |

OTHER PUBLICATIONS

Wolf, "Silicon Processing for the VLSI Era", vol. 3: The Submicron MOSFET, Lattice Press, Sunset Beach, CA, (1995), pp. 504–514.

*Primary Examiner*—Charles Bowers
*Assistant Examiner*—Evan Pert
*Attorney, Agent, or Firm*—George O. Saile; Stephen B. Ackerman

[57] ABSTRACT

It has been observed that, when a commercial plasma etcher is used for multiple etching tasks involving a variety of products, the amount of plasma damage incurred depends upon the chamber history of the etching tool. Thus, etching a gate sidewall spacer on a damage sensitive product, for example, in a MOSFET product with very thin gate oxide, may result in significant degradation of the gate oxide if the plasma etching tool had been used to etch vias on another type product in the preceding job. A method for monitoring and recording the chamber history and ascertaining the status of a plasma etching tool with regard to the tendency of said tool to introduce plasma damage in thin gate and tunnel oxide layers is disclosed. The method includes an a oxide damage monitor wafer which contains arrays of simple test devices. The monitor wafers can be partially formed and banked for later use. The test devices comprise a polysilicon plate partially covering a gate oxide. A conformal oxide is formed over the structure and the wafer is subjected to a spacer etch in the plasma etching tool being appraised. Dielectric breakdown the thin oxide is measured and the data is compared to a chamber history of the etcher. Those etching procedures which adversely affect the chamber are identified. Once a chamber history is established, the etcher can be expeditiously scheduled and the incidence of jobs lost to oxide damage greatly reduced.

20 Claims, 3 Drawing Sheets

EFFICIENT METHOD FOR MONITORING GATE OXIDE DAMAGE RELATED TO PLASMA ETCH CHAMBER PROCESSING HISTORY

BACKGROUND OF THE INVENTION (1) Field of the Invention

The invention relates to processes for the manufacture of semiconductor devices and more particularly to the degradation of thin gate oxides caused by plasma processing of polysilicon gate field effect transistors.

(2) Description of Prior Art and Background to the Invention

In the manufacture of high density integrated circuits using polysilicon gate MOSFETs (metal oxide silicon field effect transistors) technology, the oxide layer which forms the gate insulation of the MOSFET is extremely thin, in many cases, less than 100 Angstroms. When the surface of a polysilicon gate electrode or any metal layer connected to the polysilicon gate metal is subjected to plasma processing, such as in the formation of insulative sidewalls used in the LDD (lightly doped drain) structure, charges from the plasma accumulate on the metal surface. The exposed metal surface acts as an antenna, accumulating charge from the plasma and thereby developing a high electrical potential across the gate oxide. Initial exposure occurs during the patterning of the polysilicon gate electrodes. The nature of the charging varies across the wafer, being either positive or negative depending on the balance of ion and electron fluxes in the plasma. Non-uniform plasmas such as those influenced by magnetic fields can produce a high electron flux near the periphery of the wafer and high positive ion flux near the center (Wolf, S., "Silicon Processing for the VLSI Era", Vol.3, Lattice Press, Sunset Beach, Calif., (1995), p507).

After a gate oxide layer is formed on a silicon wafer substrate, the layer is covered with a layer of polysilicon or polycide within which a gate electrode is defined. The polysilicon layer is then anisotropically etched by a plasma process to form the gate electrode. This is the first in a series of plasma exposures of the gate conductive path. In this instance the area of the gate electrode is covered with photoresist and only edge regions are exposed to the plasma. After the gate electrode is formed LDD (lightly doped drain) regions are formed in the silicon active area adjacent to the gate electrode by ion implantation. A layer of insulative material such as silicon oxide is then conformally deposited over the wafer. This layer is then anisotropically etched back to re-expose the polysilicon gate and gate oxide, leaving an insulative sidewall along the periphery of the polysilicon structures. This time the entire surface of the polysilicon gate electrode is exposed to the plasma at end point and during a brief over-etch period.

Krishnan, et.al. U.S. Pat. No. 5,739,052 cites a method and test device for evaluating plasma gouging of oxide at the periphery of a polysilicon gate electrode by the polysilicon gate etching process. After etching the gate element, a blanket polysilicon layer is deposited and anisotropically etched to form a sidewall which now encompasses the gouged portion of the oxide and creates a second gouged region at the periphery of the sidewall. Oxide breakdown measurements are used to assess the gouging damage. Shiue, et.al., U.S. Pat. No. 5,781,445 shows a plasma damage FET test device, formed on a product wafer, for charging damage caused by plasma processing of upper level metallization. A conductive cover is formed over the device at a selected metallization level to shields the device from damage during subsequent plasma processing. By forming device shielding at different metallization levels, shifts in threshold voltages of the various devices isolate the processing steps in which plasma damage is incurred. Chen, et.al., U.S. Pat. No. 5,646,074 cites the use of $Q_{BD}$ and $E_{BD}$ measurements to evaluate gate oxide deterioration incurred during a chemical cleaning step for removing photoresist. Alers, et.al., U.S. Pat. No. 5,804,795 describes a method of detection and characterizing of oxide breakdown by the measurement of the intensity of noise signals emitted as breakdown processes occur. Hause, et.al., U.S. Pat. No. 5,759,871 cites a junction leakage monitor structure.

Progress has been made in the design of plasma etching tools to reduce the bombardment of substrate surfaces by excessive and unbalance charge flux from the plasma and thereby reduce the susceptibility of sensitive device regions to current degradation. However, in the new HDP (high density plasma) reactor designs, electron shading is believed to be the predominant charging mechanism which causes degradation of thin gate oxides. Electron shading occurs in plasmas as a result of the difference in isotropy between electrons and positive ions crossing the plasma sheath and onto the wafer surface. Because electrons and ions interact differently with closely spaced structures on the wafer surface, a differential charging occurs between the structures. Such a charging effect would lead to the development of a positive charge on the polysilicon gate during LDD sidewall etching.

The mechanism of current flow through gate oxides less than 100 Angstroms thick is primarily Fowler-Nordheim (FN) tunneling. FN tunneling occurs at fields in excess of 10 MV/cm. Charge build up on the gate electrode resulting in a gate electrode potential of only 10 volts is therefore sufficient to induce FN tunneling through an oxide layer of 100 Angstroms. Such potentials are readily achieved during charging in conventional plasma reactors. Excessive FN tunneling currents eventually lead to positively charged interface traps in the oxide which may lead to subsequent dielectric breakdown. Thus plasma exposure may not only lower the breakdown voltage thresholds but can also sufficiently degrade the oxide to create reliability concerns.

Recent improvements in plasma tool design have greatly reduced gate oxide damage by charging. However, factors other than tool design also contribute to plasma induced damage. The components of the etch gases themselves can influence the degree of oxide damage. Familiar etchant gases such as $SF_6$, which are highly electronegative, are also prone to induce a higher degree of plasma damage in thin gate oxides than other gas components. Again, by careful selection of gas composition and etchant parameters it is possible to further reduce plasma damage from a particular etch process. Once the process is optimized it would be expected that the gate oxide damage would be minimal and controllable in a manufacturing process.

However, in practice, this is not the case. Modern plasma etching tools are very complex and expensive and are called upon to perform a variety of etching tasks at various stages of integrated circuit manufacturing. The great variety of etching steps, involving different etchant gases, parameters, and materials to be etched do not permit the dedication of a single etching tool to each process step. Therefore, plasma etching machines are also designed to accommodate a large variety of etching tasks involving different etchant chemistries and conditions.

It has been observed by the present researchers that, when a commercial plasma etcher is used for multiple etching tasks involving a variety of different types of manufactured product, the amount of plasma damage incurred also depends upon the process history of the etching tool. For example, the damage incurred in the tunneling oxide of an EEPROM integrated circuit product during spacer etching is markedly greater than normal when the spacer etch job has been preceded by a via etch of a BiCMOS product. The influence of the BiCMOS via job in degrading thin oxide quality may persist in the etching tool over several successive jobs before the chamber recovers to a suitable level. This influence of preceding jobs in a plasma tool on the outcome of a current job is referred to herein as the chamber history effect. While chamber history is of limited consequence to the outcome of many plasma etching operations such as via etching, it is of particular importance to gate LDD sidewall etchback in the manufacture of self-aligned gate MOSFETs and in the formation of sidewall oxide over tunnel oxide layers in the manufacture of EEPROMS. It is therefore desirable to have a means for quickly, easily, and routinely qualifying a plasma etching tool prior to damage sensitive jobs such as those involving exposure to plasmas of device components adjoined to thin gate or tunnel oxides.

SUMMARY OF THE INVENTION

It is an object of this invention to provide a method for qualifying a plasma etching tool with regard to plasma damage to thin gate and tunnel oxides prior to a plasma etching procedure in which such gate or tunnel oxide layers or conductive elements adjoining gate or tunnel oxides are exposed to a plasma process.

It is a particular object of this invention to provide a design and method for making a short loop test device which can be used to qualify a plasma etching tool for the process of anisotropic plasma etching of a conformal insulator layer to form a spacer adjacent to a polysilicon gate electrode over a thin gate or tunnel oxide. A short loop device is a device which has a short turn-around time and can produce the desired test results quickly.

It is another object of this invention to provide a design and method for manufacture of a test monitor wafer which can be easily prepared in large quantities and then banked or stockpiled for ready use to evaluate the condition of a plasma etching tool with respect to plasma damage to thin oxides.

These objects are accomplished by first forming a plurality monitor wafers. Each of the monitor wafers contains and array of islands of active silicon with each island being defined and surrounded by a field oxide. The active silicon islands are then oxidized to form a thin gate or tunnel oxide layer over each island. A blanket polysilicon layer is then deposited over the wafers. The polysilicon layer is doped to increase it's conductivity and the wafers are stored or banked until required for use. When the plasma etching tool is to be evaluated, a monitor wafer is selected and the polysilicon is patterned to form an array of rectangular polysilicon plates. This exposes the thin oxide which has heretofore been protected by the polysilicon blanket. Each of the polysilicon plates partially overlaps one of the thin oxide covered islands so that there is an edge of the polysilicon plate across the thin oxide layer on the island. The remainder of each polysilicon plate extends over field oxide.

A conformal layer of a sidewall insulation material such as silicon oxide is deposited over the polysilicon structures and the monitor wafer is placed into the etching tool and the sidewall material is anisotropically etched to form a sidewall along the periphery of each of the polysilicon plates. The process step of forming a sidewall is particularly prone to gate or tunnel oxide degradation because, for the first time in the processing sequence, the isolated conductive layer over the oxide is exposed to a plasma. The areas of the polysilicon plates used in the monitor devices as well as the areas of the active silicon covered by the polysilicon plates are chosen according to the oxide damage level to be investigated. The polysilicon plates are large enough so that they can be probed directly at a point over the field oxide. Thus there is no need for additional probe pads or wiring connections.

To determine the effect of a particular etching recipe or task on the chamber history of the plasma etcher, a monitor wafer is subjected to the sidewall etching process step prior to exercising the test recipe to provide a calibration. The test devices on the monitor wafer are measured by $Q_{BD}$ (Charge-to-breakdown) and $E_{BD}$ (Breakdown field) measurements which are conventionally used to evaluate thin oxide damage. Next the etching process step to be evaluated is run on the designated product using the prescribed etchants and conditions for that step. After the process step is run, a second monitor wafer is subjected to the sidewall etching procedure in the next job. Preferably routine calibration runs are made by periodically sidewall etching monitor wafers to provide a running log of the condition of the etching tool. In this way etching jobs may be scheduled to minimize the risk to the most damage sensitive jobs. In addition, the recovery behavior of the etching tool from etch jobs which severely impact the tool's condition may be determined in a timely manner.

DESCRIPTION OF THE PREFERRED EMBODIMENTS

In an embodiment of this invention a 200 mm p-type monocrystalline silicon wafer is provided. The resistivity of the wafer is between about 3 and 20 ohm cm. As used in the current application, the oxide damage test devices are formed on wafers dedicated as oxide damage monitor wafers. A plurality of oxide damage test devices are formed over the entire wafer surface. The patterning of the devices is done by standard photolithography, preferably by the use of a stepper. A stepper reticle is designed to form an array of between about 80 and 100 test devices on a 10 by 10 mm. die pattern. Photoresist on the wafer is exposed by stepping the reticle over the wafer according to a wafer map which encompasses as much of the wafer surface as possible. Two photolithographic patterning steps are required to form the device. The first pattern defines an array of islands of active silicon in a matrix of field oxide and the second defines a corresponding array of polysilicon plates which partially overlap the islands.

Figure 1:
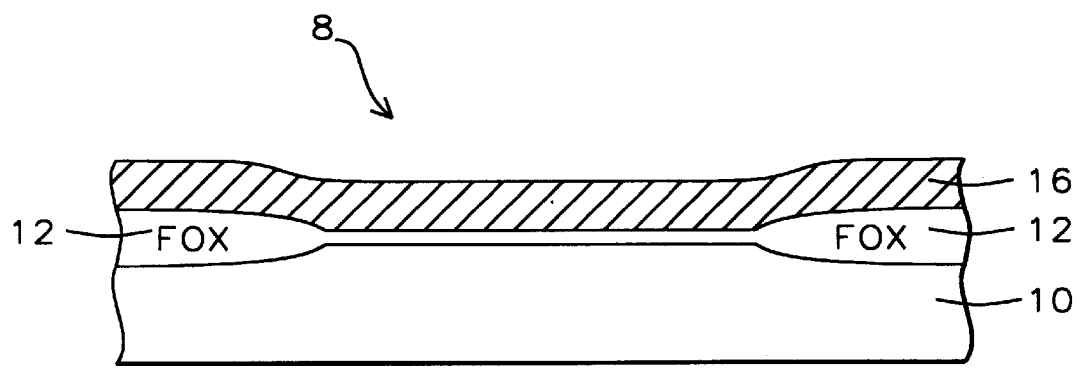
FIG. 1 is a cross section of a partially formed oxide damage test device formed on a plasma damage monitor wafer according to the teaching of this invention.
Figure 3:
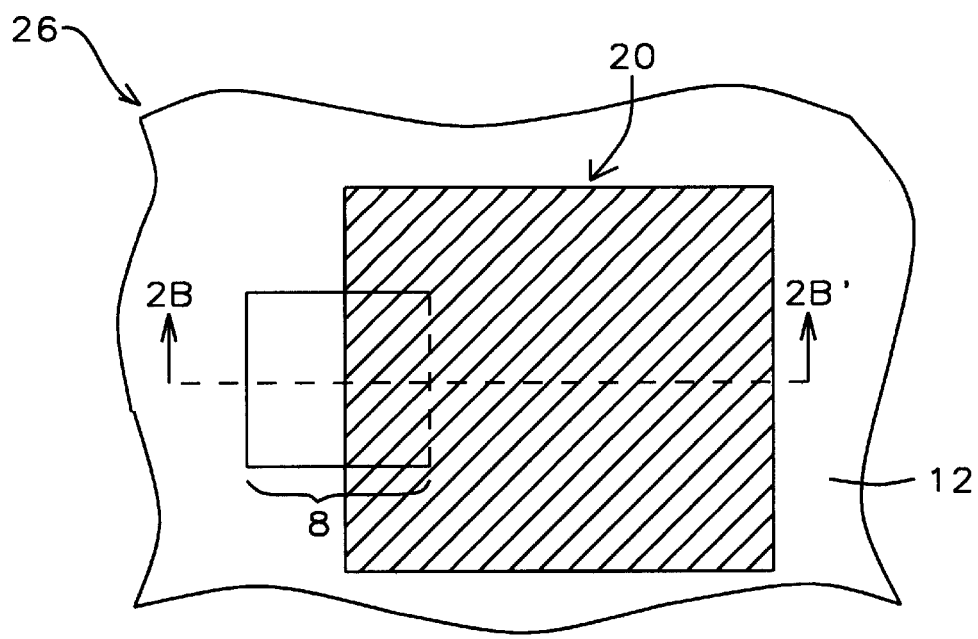
FIG. 3 is a planar view of a completed oxide damage test device showing the disposition of a polysilicon plate over and island of active silicon prior to the deposition of a conformal layer of sidewall oxide.

Referring to FIG. 1, there is shown a cross section of the silicon wafer 10, illustrating a region wherein a single oxide damage test device is to be formed. A field oxide (FOX) 12 is formed on the silicon wafer 10 by the well known process of local oxidation of silicon(LOCOS). For this a silicon nitride/pad oxide mask is first patterned to define an island 8 of active silicon. The island of active silicon is preferably rectangular and has dimensions which are between about 80 and 1,000 microns wide by between about 100 and 1,200 microns long. The cross section shown in FIG. 1 is taken along the long dimension. A planar view of the test structure is shown in FIG. 3.

A gate oxide 14 is grown in the exposed silicon region. The gate oxide 14 is grown in dry oxygen to a thickness of between about 60 and 250 Angstroms. A polysilicon layer 16 is then deposited over the gate oxide 14 by low pressure chemical vapor deposition(LPCVD). The as-deposited polysilicon layer 16 is undoped and is between about 500 and 4,000 Angstroms thick. After deposition, the polysilicon layer 16, is doped with phosphorous to lower it's resistivity. A simple $POCl_3$ diffusion in a furnace at between about 800 and 1,000° C. is sufficient to lower the resistivity to between about 6 and 12 ohms per square. Alternately, the polysilicon layer 16 may be doped with another dopant such as arsenic. Ion implantation may also be used to administer the desired dopant ions.

At this stage of processing the wafer 10, containing the partially formed test devices, may be banked or stockpiled. The gate oxide 14 is protected by the blanket polysilicon layer 16 and the wafer may be stored indefinitely until required for use.

Figure 2A:
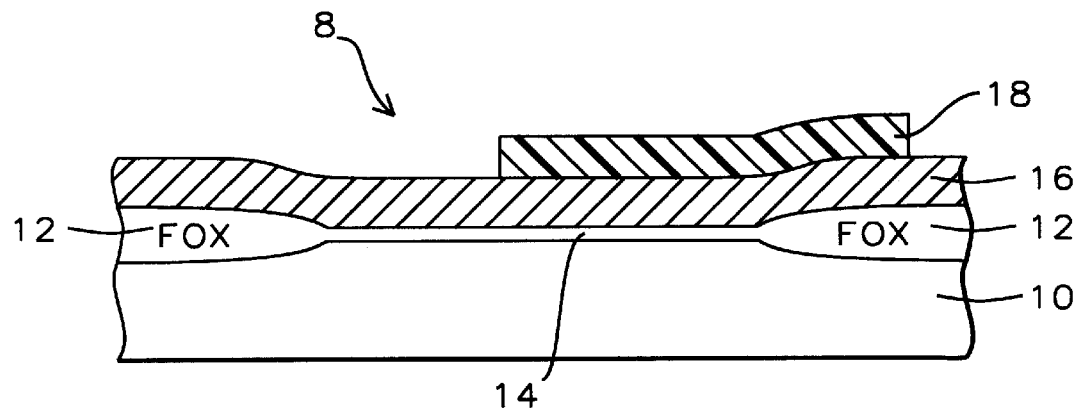
FIG. 2A through FIG. 2C are cross sections showing processing steps used to the complete the formation of a oxide damage test device formed on a plasma damage monitor wafer prior to plasma etching exposure according to the teaching of this invention.
Figure 2B:
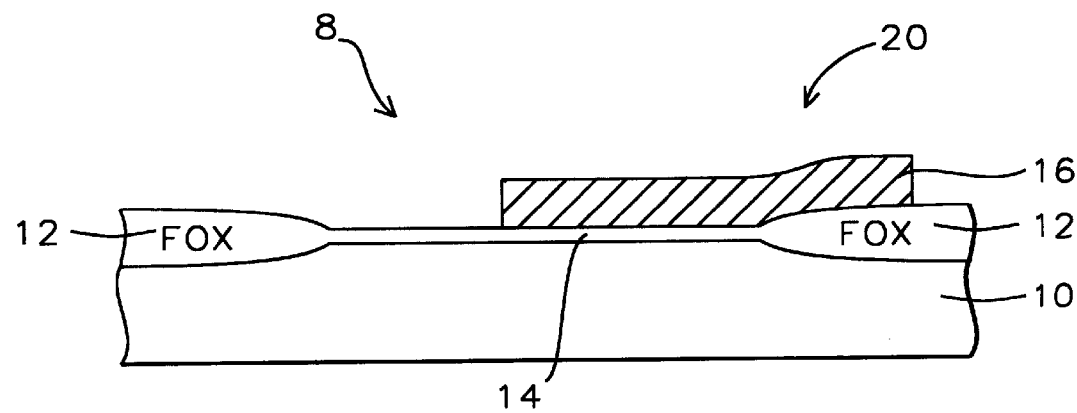

When a plasma damage evaluation of a plasma etching tool is to be performed, a wafer is selected from the test wafer stockpile and the test device is completed by first patterning the polysilicon layer to form a polysilicon plate which extends over the thin gate oxide 14. Referring to FIG. 2A a layer of photoresist 18 is patterned to define the plate and the polysilicon layer 16 is anisotropically etched in a plasma etching tool which is configured for etching conductive materials, for example, the Model TCP 9400 manufactured by LAM Research Corporation of Fremont, Calif. The polysilicon layer 16 is etched using etchant conditions which provide a high polysilicon/silicon oxide etch rate ratio so that there is minimal attack of the exposed thin oxide. Such etchant recipes are well known in the art and typically contain a halogen containing species such as HBr. In order to assure that all vestiges of polysilicon other than that protected by the photoresist are thoroughly removed, an extensive over-etch period of between about 50 and 120 percent is required. During this time both the polysilicon plate 20 and a portion of the gate oxide 14 are exposed to the plasma. The completed polysilicon plate 20 is shown in FIG. 2B.

In FIG. 3 there is shown a plan view of the plasma damage test device 26. The placement of the polysilicon plate 20 over the gate oxide on the active silicon region 8 is shown. The cross section shown in FIG. 2B is designated by the line 2B–2B' in FIG. 3. The rectangular polysilicon plate 20 is between about 80 and 1,000 microns wide and between about 100 and 1,200 microns long, extending over the field oxide in the long direction.

Figure 2C:
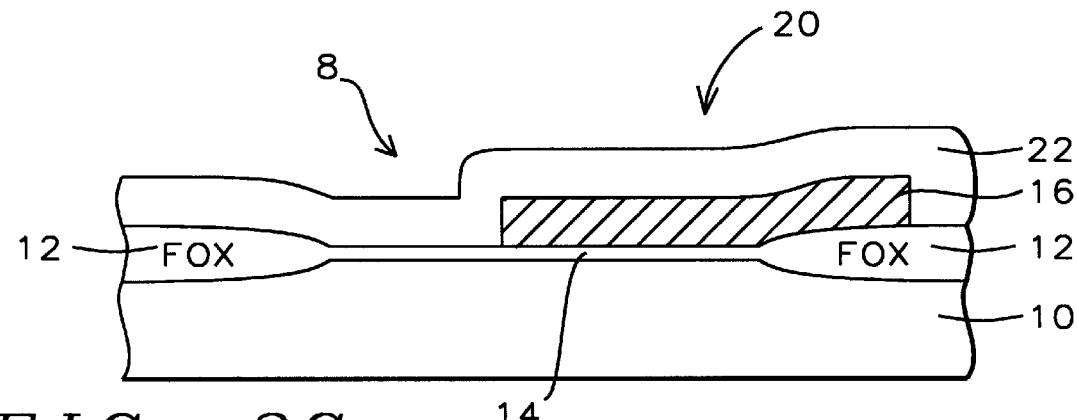

Referring to FIG. 2C, a conformal layer of silicon oxide 22 is next deposited onto the selected wafer 10, preferably by PECVD (plasma enhanced chemical vapor deposition). The silicon oxide layer 22 is deposited to a thickness of between about 800 and 3,000 Angstroms using TEOS (tetraethyl orthosilicate) as a precursor and a deposition temperature of between about 400 and 800° C. TEOS silicon oxide deposition by PECVD is a well known practice in the semiconductor industry and the process is well characterized. The plasma damage test structure is now complete and the wafer 10 is ready to be etched in the plasma etching tool to be evaluated.

In the present embodiment the plasma etching tool selected is the Model 4520 Dielectric etch system manufactured by the LAM Research Corporation of Fremont, Calif. The Model 4520 is a reactive ion etching machine which provides a great deal of flexibility for etching various types of contacts and vias as well as nitride and oxide sidewall spacers and openings in passivation layers. Because of the etcher's great flexibility, it is typically called upon to process a number of different types of insulators on great variety of different semiconductor products and is thus exposed to many different etchant chemistries and etching parameters. It is apparent that a method for logging the chamber history of such an etching tool with respect to plasma damage is expeditious and useful.

Figure 4:
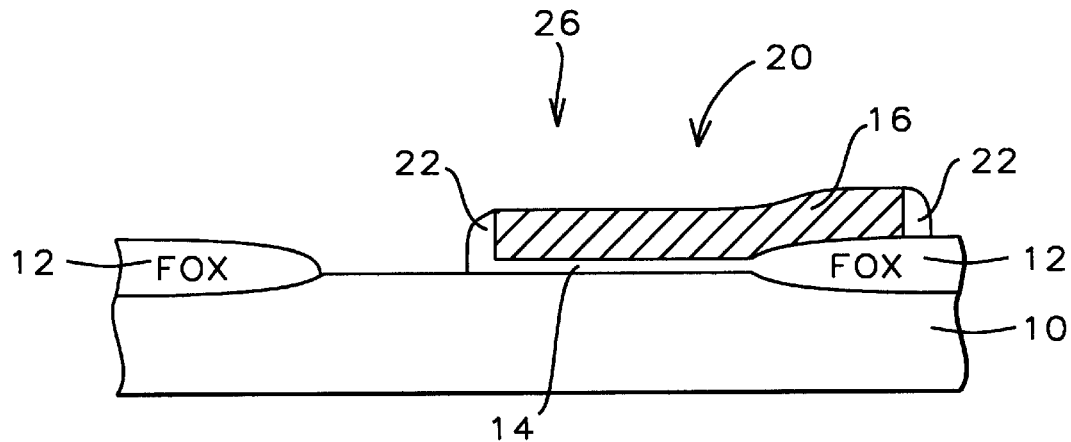
FIG. 4 is a cross section of a completed oxide damage test device formed on a plasma damage monitor wafer after plasma etching exposure according to the teaching of this invention.

The wafer 10 is loaded into the chamber of the plasma etcher and the silicon oxide layer is anisotropically etched until the polysilicon plate 20 is exposed. The etching conditions and etchant composition used in this embodiment consists of flowing a gas containing $CF_4$ at a flow rate of between about 40 and 60 SCCM (standard cubic centimeters per minute) in an argon carrier gas at a flow rate of between about 400 and 600 SCCM. The pressure in the chamber is maintained at between about 800 and 1,200 mTorr. rf power is applied at between about 400 and 500 Watts with zero substrate bias. These etching conditions provide an etch rate selectivity of between about 5 and 10 to 1 for silicon oxide-to-silicon. When the polysilicon plate is exposed, as determined by optical emission spectroscopy, an over-etch period of between about 3 and 10 percent is conducted. The test device 26 now appears as shown in the cross section of FIG. 4 where the entire planar portions of the silicon oxide layer have been removed leaving only the sidewall portions 22 along the edges of the polysilicon plate 20.

During the plasma process, and in particular at the end of the etching and during the over-etch period, the polysilicon plate 20 is directly exposed to the plasma permitting charging to take place which produces a high electric field across the thin oxide layer 14. The devices are next measured to determine the amount of oxide damage produced. The test wafer 10 is removed from the etching tool and $Q_{BD}$ and $E_{BD}$ measurements are made on a number of test devices in each of a number of locations on the wafer surface. Preferably, measurements are made to sample central and peripheral regions of the wafer to acquire a wafer surface profile of the measured parameters. The measurement procedures for $Q_{BD}$ and $E_{BD}$ are well documented and are often used to assess oxide quality. On the test devices used in the current embodiment, the measurements are made by applying probes to each of the polysilicon plates and applying a test signal between the plates and a contact to the substrate wafer. The conventional manner of presenting the statistical $Q_{BD}$ data in normalized form, is a plot of the cumulative probability of $Q_{BD}$ versus the $Q_{BD}$ in charges per $cm^2$. ($C/cm^2$). Data is taken on test devices located at various locations on the wafer so that wafer map information may also be obtained. It is found that the central region of the wafer is more sensitive to charging damage than the outer regions.

It is found, by measuring test devices on monitor wafers formed as hereinbefore described, that although each of the monitor wafers are processed in the same way within the plasma etcher, the damage measured on each monitor wafer after etching procedure, is not always the same but depends upon the etching conditions of jobs which preceded each monitor etch job.

Figure 5:
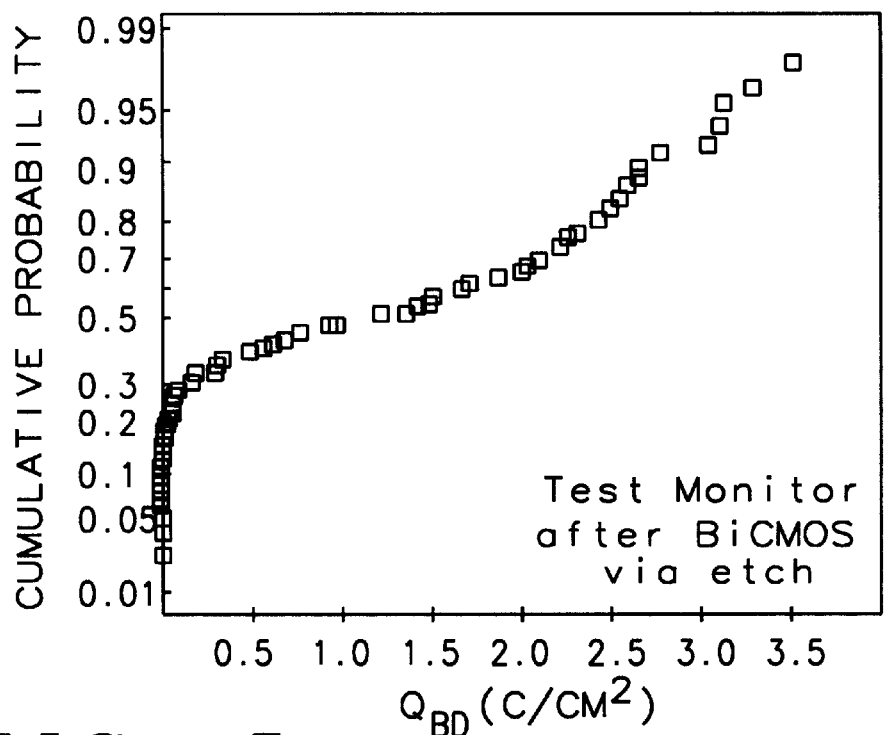
FIG. 5 is a plot showing the cumulative probability of $Q_{BD}$ as a function of $Q_{BD}$ as measured on test devices on a plasma damage monitor wafer described by this invention after the monitor wafer was etched in a plasma etching tool which had just performed a via etch on a BiCMOS product wafer in the previous job.

FIG. 5 is a graph showing the variation of the cumulative probability Of $Q_{BD}$ with $Q_{BD}$ for a devices on a plasma monitor wafer which was processed in the manner just described, in a job directly after a job wherein a via etch was performed on a BiCMOS product wafer. The via etching was performed using an etchant gas containing CF4 at a chamber pressure of 300 mTorr. The insulative layer in which the vias were etched was a 6,500 Angstrom thick silicon oxide layer. The thickness of the gate oxide layer 14 on the test devices was 80 Angstroms. About 30 percent of the measured devices show failure at the very onset of the measurement indicating a significant amount of plasma induced damage to the oxide layer.

Figure 6:
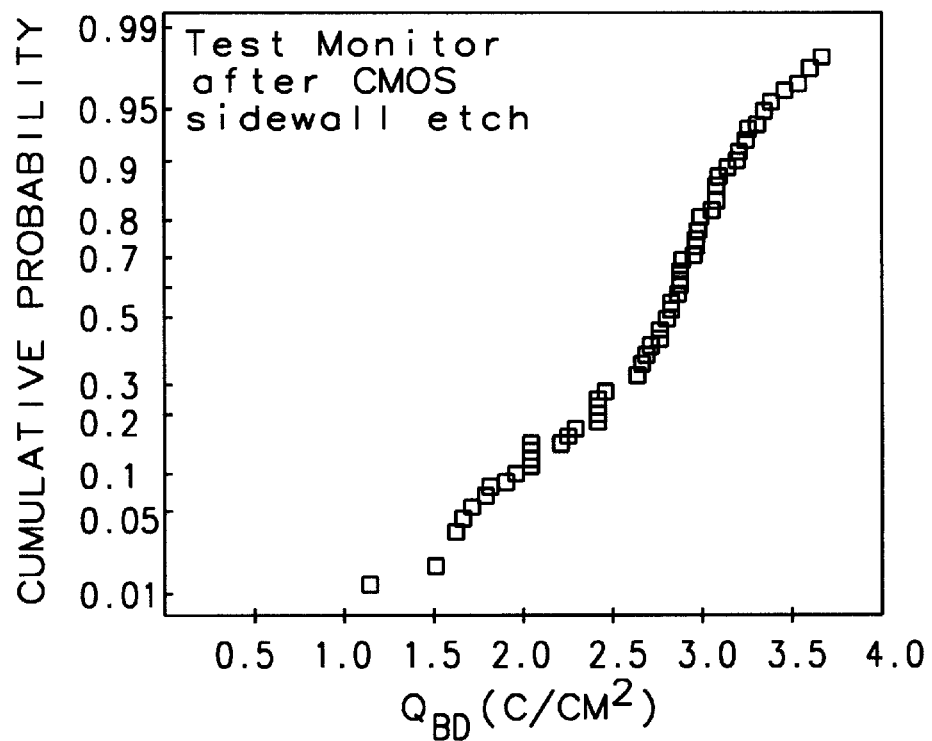
FIG. 6 is a plot showing the cumulative probability of $Q_{BD}$ as a function of $Q_{BD}$ as measured on test devices on a plasma damage monitor wafer described by this invention after the monitor wafer was etched in a plasma etching tool after a sidewall etch job on a CMOS EEPROM product wafer.

In contrast, FIG. 6 shows a comparable $Q_{BD}$ graph of data from another plasma damage test wafer formed and processed according to the procedure of the embodiment of this invention. The etching task performed by the plasma tool just prior to the etching of the test wafer which produced the data shown in FIG. 6, comprised the etching of sidewalls on a CMOS EEPROM product wafer.

The plasma damage monitor wafers used in acquiring the data shown in FIGS. 5 and 6 were processed under the same etching conditions and both had identical oxide and thicknesses. In each case the data shown was taken from corresponding locations on each wafer. The only difference was the nature of the etching tasks that had been performed by the etching tool just prior to the monitor wafer run. Clearly, previous BiCMOS via etch process has affected the components of the etching chamber in a way to cause significant degradation of the gate oxide quality in the subsequent, damage sensitive, etch job.

The mechanisms which contribute to produce a chamber history effect in a plasma etcher are complex and not well understood although it is believed that fluoride radicals in recent jobs contribute to the effect. Via etching jobs also appear to be dominant contributors to damage in subsequent jobs. The chamber contamination effect of a previous etching job is not necessarily swept out by the very next job. In fact may take several etching tool operations to restore the tool to a "clean" condition. In assessing the condition of the etching tool it is therefore important to note the etching parameters and product characteristics of at least the 5 most recent etching tasks which were processed by the tool. Etching parameters noted should include plasma parameters, etchant gases, flow rates and pressures. Process characteristics should include product identification, materials being etched and materials on the wafer which are exposed during the etch process.

By performing test runs using the plasma damage monitor wafers taught by this invention, it is possible to categorizes those jobs which significantly affect subsequent jobs and take remedial measures to re-condition the etch chamber after such jobs are run. The etch chamber can be restored to a clean condition either by applying standard preventative maintenance cleaning or by processing one or more control or dummy wafers before processing a damage sensitive product job. The number of reconditioning jobs required can easily be determined, once a database has been established.

Once the processing tasks are categorized, it is possible, not only to maintain a reliable etching environment for each job but also to more effectively schedule etching jobs as the manufacturing cycle permits. New products or new etching recipes can be evaluated with test monitors and their impact on chamber history assessed prior to their introduction into the manufacturing cycle. Job scheduling may be optimized to queue highly damage sensitive jobs together as such as possible in order to reduce the frequency of chamber cleaning or reconditioning.

While this invention has been particularly shown and described with reference to the preferred embodiments thereof, it will be understood by those skilled in the art that various changes in form and details may be made without departing from the spirit and scope of the invention. While the embodiments of this invention utilize a p-type silicon substrate, an n-type silicon substrate could also be used without departing from the concepts therein provided.

What is claimed is:

1. A method for assessing effect of chamber process history of a plasma etching tool on the capacity of said tool to introduce plasma damage in thin gate and tunnel oxide layers during gate sidewall etching comprising:

(a) providing a monitor wafer with a region containing test devices comprising:
  (i) a gate oxide formed over each of an array of islands of active silicon area surrounded by a field oxide;
  (ii) an array of polysilicon plates formed over said gate oxides, each of said array of polysilicon plates partially covering corresponding said gate oxide of one of said array of islands, and extending over a portion of said field oxide, whereby each of said polysilicon plates, corresponding said gate oxide, and corresponding said island comprises a test device;
  (iii) a conformal insulative layer on said array of polysilicon plates and entirely covering said region;
(b) loading said monitor wafer into an etch chamber of a plasma etcher;
(c) evacuating said etch chamber;
(d) anisotropically etching said conformal insulative layer in said plasma etcher for a first time period with a first etchant gas under a first set of parameters thereby exposing said polysilicon plates;
(e) subjecting said wafer to an over-etch for a second time period;
(f) unloading said wafer from said plasma etcher;
(g) measuring and recording a set of oxide damage data by performing electrical measurements on a plurality of said test devices;
(h) recording etching parameters and process characteristics of each of a number of most recent previous jobs performed in said etching chamber; and
(i) correlating said oxide damage data to said etching parameters and said process characteristics.

2. The method of claim 1 wherein said gate oxide is between about 60 and 250 Angstroms thick.

3. The method of claim 1 wherein said polysilicon plates are between about 500 and 4,000 Angstroms thick.

4. The method of claim 1 wherein said polysilicon plates are rectangular, being between about 80 and 1,000 microns wide and between about 100 and 1,200 microns long.

5. The method of claim 1 wherein said conformal insulative layer is silicon oxide deposited to a thickness of between about 1,800 and 3,000 Angstroms.

6. The method of claim 1 wherein said plasma etched is a reactive ion etcher.

7. The method of claim 1 wherein said second time period is between about 3 and 10 percent of said first time period.

8. The method of claim 1 wherein said electrical measurements are charge-to-breakdown measurements of said gate oxide.

9. The method of claim 1 wherein said electrical measurements are measurements of the breakdown field of said gate oxide.

10. The method of claim 1 wherein said number of most recent previous jobs is about 5.

11. The method of claim 1 wherein said process characteristics include product identification, materials etched, and materials exposed during said etching.

12. A method for qualifying a plasma etching tool for etching sidewall spacers on a gate and tunnel oxide layers comprising:
   (a) providing a monitor wafer with a region of test devices comprising:
      (i) a gate oxide formed over each of an array of islands of active silicon area surrounded by a field oxide;
      (ii) an array of polysilicon plates formed over said gate oxides, each of said array of polysilicon plates partially covering corresponding said gate oxide of one of said array of islands, and extending over a portion of said field oxide, whereby each of said polysilicon plates, corresponding said gate oxide, and corresponding said island comprises a test device;
      (iii) a conformal insulative layer on said array of polysilicon plates and entirely covering over said region;
   (b) loading said monitor wafer into an etch chamber of a plasma etcher;
   (c) evacuating said etch chamber;
   (d) anisotropically etching said conformal insulative layer in said plasma etcher for a first time period with a first etchant gas under a first set of parameters thereby exposing said polysilicon plates;
   (e) subjecting said wafer to an over-etch for a second time period;
   (f) unloading said wafer from said plasma etcher;
   (g) measuring and recording a set of oxide damage data by performing electrical measurements on a plurality of said test devices; and
   (h) comparing said set of oxide damage data to a specification of allowable oxide damage.

13. The method of claim 12 wherein said gate oxide is between about 60 and 250 Angstroms thick.

14. The method of claim 12 wherein said polysilicon plates are between about 500 and 4,000 Angstroms thick.

15. The method of claim 12 wherein said polysilicon plates are rectangular, being between about 80 and 1,000 microns wide and between about 100 and 1,200 microns long.

16. The method of claim 12 wherein said conformal insulative layer is silicon oxide deposited to a thickness of between about 1,800 and 3,000 microns.

17. The method of claim 12 wherein said plasma etched is a reactive ion etcher.

18. The method of claim 12 wherein said second time period is between about 3 and 10 percent of said first time period.

19. The method of claim 12 wherein said electrical measurements are charge-to-breakdown measurements of said gate oxide.

20. The method of claim 12 wherein said electrical measurements are measurements of the breakdown field of said gate oxide.

* * * * *